United States Patent [19]
Fisher et al.

[11] 4,253,066
[45] Feb. 24, 1981

[54] SYNCHRONOUS DETECTION WITH SAMPLING

[76] Inventors: Charles B. Fisher, 2850 Hill Park Rd., Montreal, Quebec H3H 1T1, Canada; Sidney T. Fisher, 53 Morrison Ave., Mt. Royal, Montreal, Quebec H3R 1K3, Canada

[21] Appl. No.: 149,336

[22] Filed: May 13, 1980

[51] Int. Cl.³ .......................... H03D 1/04; H03D 1/24
[52] U.S. Cl. ...................................... 329/50; 455/202; 455/312; 455/337
[58] Field of Search .................. 329/50; 455/202, 203, 455/312, 337; 375/104

[56] References Cited

U.S. PATENT DOCUMENTS

| | | | |
|---|---|---|---|
| 2,194,292 | 3/1940 | Bligh et al. | 455/311 |
| 2,778,933 | 1/1957 | Crist | 329/50 |
| 2,780,807 | 2/1957 | Frank | 343/103 |
| 3,430,151 | 2/1969 | Badessa | 329/50 |
| 4,178,553 | 12/1979 | Fisher et al. | 329/50 X |
| 4,182,932 | 1/1980 | Fisher et al. | 329/50 X |

OTHER PUBLICATIONS

Reference Data for Radio Engineers, Howard W. Sams, 1969, pp. 21-4, 21-5, 21-13, 21-14.
Transmission Systems for Communications, Bell Telephone Laboratories, 4th Edition, pp. 103, 104.
Weiss, "Heart-Sound Discriminator Simplifies Medical Diagnosis", Electronics 34:24, pp. 52-55.
Prigozy, "Zero-Crossing Detector Provides Fast Sync Pulses", Electronics, Apr. 19, 1965, p. 91.
Ferrara, "Delayed Pulse Generator", EEE, 13:10, p. 71.

*Primary Examiner*—Siegfried H. Grimm

[57] ABSTRACT

In receiving apparatus for a double-sideband amplitude-modulated wave, a synchronous detector which samples the modulated wave for short periods centered on instants of peaks of the carrier at regularly-occurring intervals, with a sampling frequency greater than the Nyquist frequency for the modulating wave, equal to the carrier frequency divided by an integer, and reconstructs the modulating wave from the sequence of samples in a reconstruction filter. This detector has a high output signal-to-noise ratio and produces a distortionless output with positive or negative overmodulation, and with reduced or suppressed carrier.

1 Claim, 2 Drawing Figures

SYNCHRONOUS DETECTION WITH SAMPLING

BACKGROUND OF THE INVENTION

This invention relates to synchronous detectors for double-sideband amplitude-modulated waves, which have improved signal-to-noise ratios over detectors of the prior art.

In synchronous detectors of the prior art sampling of the modulated carrier takes place at the carrier frequency only, whereas in apparatus according to this invention short samples are taken at a frequency equal to the carrier frequency divided by an integer, at a frequency greater than the Nyquist frequency for the modulating wave, centered on approximate instants of carrier peaks, and the samples are reconstructed in a filter with its high cut-off frequency substantially equal to the highest modulating frequency.

BRIEF DESCRIPTION OF THE INVENTION

A double-sideband amplitude-modulated input wave, with full carrier, reduced carrier or suppressed carrier, is passed through a sampling gate which samples the wave at regularly-occurring intervals, for short periods centered on instants of peaks of the carrier, at a frequency greater than the minimum sampling or Nyquist frequency of the modulating wave, and equal to the carrier frequency divided by an integer. The resultant sequence of samples is passed through a filter with the pass-band of the modulating wave frequency band, which reconstructs an accurate replica of the modulating wave of the input wave at the sampling gate, subject to amplitude and delay distortion in the pass-band of the filter. The pulse sequence required by the sampling gate is produced by deriving the carrier from the input wave free from noise and sidebands, and passing the freed carrier through frequency dividing, pulse generating and delay circuits.

DETAILED DESCRIPTION OF THE INVENTION

This invention is based on the following theory:

(1) A band-limited wave is fully defined by a sequence of short samples taken at regularly-occurring intervals at a frequency greater than the well-known minimum sampling or Nyquist frequency, which is a discontinuous function of the bandwidth of the wave and the highest frequency of the wave. For generalized waves this function varies from two to four times the bandwidth of the wave. For a double-sideband amplitude-modulated wave the Nyquist frequency varies from two to four times the maximum frequency of the modulating function.

(2) A sequence of short samples of a band-limited wave occurring at regular intervals at a frequency greater than the Nyquist frequency for the wave may be accurately reconstructed as an analog replica of the wave, by a filter passing only the frequency band of the wave, subject to frequency and delay distortion in the pass-band of the filter. Samples of a double-sideband amplitude-modulated wave may be reconstructed as an accurate replica of the modulating function, by a filter passing only the modulating function, subject to frequency and delay distortion in the pass-band of the filter.

(3) The peaks of a double-sideband amplitude-modulated wave occur near instants of carrier peaks whether the carrier is fully present, or partly or completely suppressed. The zero-crossings of the modulated wave occur at instants of zero-crossings of the carrier.

Figure 1:
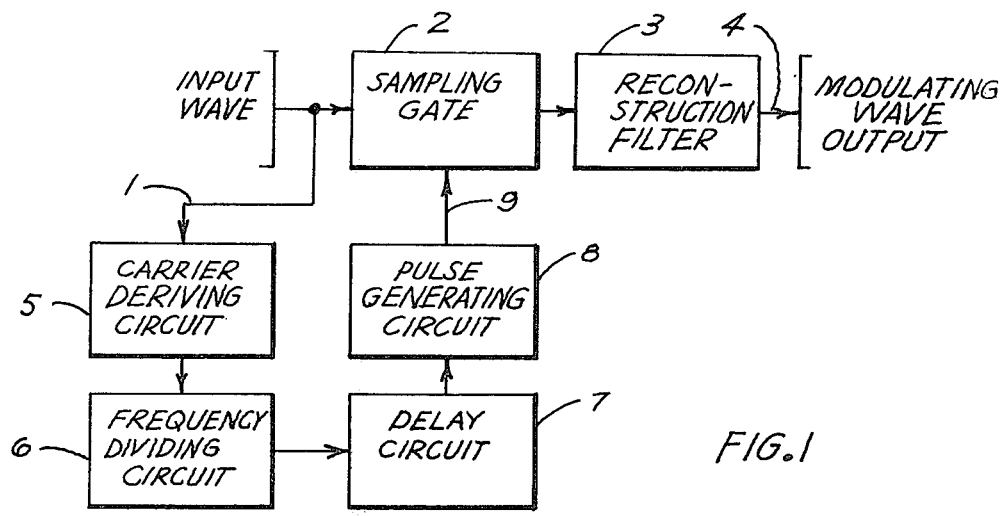
FIG. 1 shows a simplified block schematic circuit diagram of receiving apparatus according to the invention.

FIG. 1 shows a simplified block schematic circuit diagram of receiving apparatus according to the invention. A double-sideband amplitude-modulated input wave is delivered from the i-f amplifier of a radio receiver or other similar source, by lead 1, to sampling gate 2 and to carrier deriving circuit 5. Sampling gate 2 is normally closed and is opened for short periods substantially centered on instants or peaks of the carrier of the input wave at regularly-occurring intervals, by a sequence of pulses delivered to gating lead 9, with a repetition frequency greater than the Nyquist frequency of the modulating function of the input wave, and equal to the carrier frequency divided by an integer. The resulting sequence of samples of the input wave is delivered to reconstruction filter 3 which is a filter with a pass-band approximately equal to the frequency band of the modulating function of the input signal. For example, if the wave on lead 1 has a carrier at a frequency of 456 kHz, double-sideband amplitude-modulated by a wave extending from 60 to 7500 Hz, which has a Nyquist frequency of approximately 15 kHz, is sampled at the carrier frequency divided by the integer 19, giving a sampling frequency of 24 kHz, filter 3 may be a band-pass filter with a pass-band of 60 to 7500 Hz, or a low-pass filter with a cut-off frequency of 7500 Hz. Filter 3 delivers its output to modulating wave output 4.

The input wave is used in carrier deriving circuit 5 to produce an output of the carrier frequency, or twice the carrier frequency, substantially free from noise and sidebands. If a carrier of substantial amplitude is present on lead 1 this result may be achieved by selective circuits, with or without frequency and phase synchronization of a local oscillator at the carrier frequency. If the received signal has small amounts of carrier angle modulation due to multipath signal transmission or for other reasons, the selective circuits may form a narrow band-pass filter, with a pass-band less than twice the frequency of the lowest modulating frequency and substantially centered on the carrier frequency. If the carrier does not have substantial amplitude on lead 1, the sidebands on lead 1 may be multiplied together in a well-known manner in a non-linear circuit in carrier deriving circuit 5, to produce a wave at twice the carrier frequency, which can be substantially freed from noise and sidebands by selective circuits, with or without frequency and phase synchronization of a local oscillator at twice the carrier frequency, or by a narrow band-pass filter.

The output of carrier deriving circuit 5 is delivered to frequency dividing circuit 6, which divides the frequency from the carrier dividing circuit by an integer, which may be one, and which delivers the divided frequency through delay circuit 7 to pulse generating circuit 8. The ratio of frequency division in frequency dividing circuit 6, and the amount of delay in delay circuit 7, are chosen so that short pulses are delivered by pulse generating circuit 8 to gating lead 9 of sampling gate 2, centered in time on instants of peaks of the carrier of the input wave on lead 1, at regularly-occurring intervals, with a repetition frequency greater than the Nyquist frequency for the modulating function of the input wave, and equal to the carrier frequency of the input wave divided by an integer. Frequency dividing circuits are well known in the prior art. Delay circuit 7 may take the form of a delay circuit located between frequency dividing circuit 6 and pulse generating circuit 8 as shown, or may be one of a number of well-known pulse delay circuits, located between pulse generating circuit 8 and sampling gate 2.

The sequence of samples of the input wave generated by sampling gate 2 is delivered to reconstruction filter 3, which is a band-pass filter with substantially the pass-band of the modulating function of the input signal, or a low-pass filter with the cut-off frequency approximately equal to the highest frequency of the modulating function of the input signal. Reconstruction filter 3 delivers the modulating wave to output lead 4, having reconstructed it according to the sampling theorem from the input wave samples.

Figure 2:
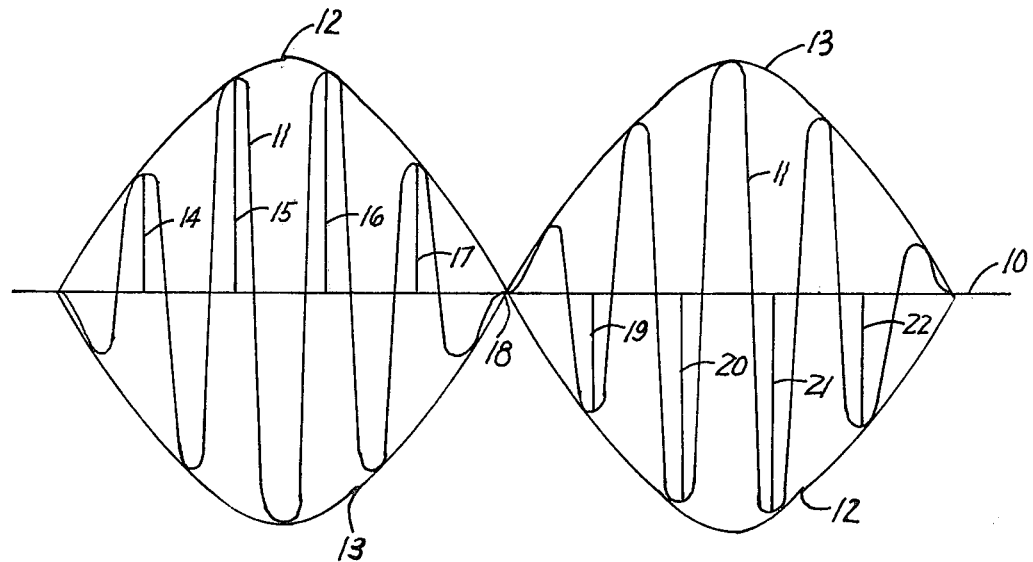
FIG. 2 shows waveforms at several points in the circuit of FIG. 1.

FIG. 2 shows waveforms occurring in the circuit of FIG. 1, erected on time base 10. In order to demonstrate a worst case, double-sideband amplitude-modulated wave 11 is shown as two single-frequency sidebands without carrier present. The carrier is assumed to be modulated with a single sine wave 12, and 12 and 13 are the envelopes of the modulated wave. Samples 14 to 22 inclusive are taken with a sampling frequency equal to the carrier frequency, at approximate instants of peaks of the carrier. It is clearly seen that the samples fully define the modulating wave 12, as there are 10 samples per cycle, whereas sampling theory requires more than two samples per cycle. Thus samples 15, 18 and 21 only fully define modulating wave 12. As FIG. 2 shows, with a modulated wave with suppressed carrier, which may be described as a modulated carrier with extreme overmodulation in both the positive and negative directions, it is clear that the synchronous detector of this invention demodulates these waves without distortion. This feature has special utility in stereo systems using two a-m demodulators.

If frequency dividing circuit 6 divides by one, it may obviously consist of merely a connecting circuit.

Delay circuit 7 may also be merely a connecting circuit if carrier deriving circuit 5 and frequency dividing circuit 6 have no delay, or delay equal to an integral number of half-periods of the carrier frequency.

The apparatus of this invention improves signal-to-noise-ratio as the sampling takes place for short periods at modulated wave peaks.

We claim:

1. Synchronous detection apparatus for a doublesideband amplitude-modulated wave, modulated by a band-limited modulating function, which comprises:

sampling means which samples the modulated wave for short periods substantially centered in time on at least some of the instants of peak amplitude of the carrier of said modulated wave, at regularly-occurring intervals, with a frequency which is greater than the minimum sampling or Nyquist frequency of said modulating function, and which is equal to the frequency of said carrier divided by an integer, and reconstruction filter means which receives the output of said sampling means and has a pass-band extending downwards substantially from the highest to at least the lowest frequency of said modulating function and which delivers the output of said filter means to an external circuit, and carrier deriving means which derives an integral multiple of said carrier frequency from said modulated wave, and frequency dividing means which receives the output of said carrier deriving means and which divides the frequency of said output of said carrier deriving means by an integer, and pulse generating means which receives the output of said frequency dividing means and produces a sequence of pulses with short periods at regularlyoccurring intervals, with a repetition frequency greater than the minimum sampling or Nyquist frequency of said modulating function, and equal to said carrier frequency divided by an integer, and which delivers said sequence of short pulses to the gating lead of said sampling means, and delay means which delays each of said pulses which is delivered to said gating lead so as to be substantially centered in time on an instant of a peak amplitude of said carrier.

* * * * *